(12) United States Patent
Chen et al.

(10) Patent No.: US 8,459,480 B2
(45) Date of Patent: Jun. 11, 2013

(54) CASE STRUCTURE AND METHOD FOR PRE-FORMING THE SAME

(75) Inventors: Kuei-Hua Chen, Taipei (TW);
Jung-Lung Chen, Taipei (TW);
Ming-Ting Lin, Taipei (TW)

(73) Assignee: Inventec Corporation, Taipei (TW)

( * ) Notice: Subject to any disclaimer, the term of this patent is extended or adjusted under 35 U.S.C. 154(b) by 406 days.

(21) Appl. No.: 12/773,596

(22) Filed: May 4, 2010

(65) Prior Publication Data
US 2011/0273069 A1    Nov. 10, 2011

(51) Int. Cl.
*B65D 6/28* (2006.01)
*B65D 8/18* (2006.01)
*B65D 21/02* (2006.01)
*B65D 8/06* (2006.01)
*B65D 21/00* (2006.01)

(52) U.S. Cl.
USPC ..... 220/4.02; 220/3.9; 220/23.83; 220/23.87; 220/23.89; 220/608; 206/505

(58) Field of Classification Search
USPC ............... 220/3.8, 3.9, 4.02, 23.83, 23.87, 220/23.89, 608; 206/503, 505, 507, 701, 206/721, 723; 29/505; 312/352
See application file for complete search history.

(56) References Cited

U.S. PATENT DOCUMENTS

| 2,515,709 | A | * | 7/1950 | Heard et al. | 220/23.87 |
| 5,121,838 | A | * | 6/1992 | Dickie | 206/454 |
| 6,369,322 | B1 | * | 4/2002 | Gretz | 174/50 |

* cited by examiner

*Primary Examiner* — Anthony Stashick
*Assistant Examiner* — Madison L Poos
(74) *Attorney, Agent, or Firm* — Morris Manning & Martin LLP; Tim Tingkang Xia, Esq.

(57) ABSTRACT

A case structure and a method for pre-forming the same are described. The pre-forming method includes the following steps. A first case body and a second case body are supplied. Two side plates of the second case body are bent, such that the two side plates respectively form an initial angle with the bottom plate. The second case body is disposed in the first case body. The two side plates are pulled to respectively come close to two side walls of the first case body, such that the bottom plate forms a curved surface in the first case body. When having an object disposed therein, the case structure overcomes a downward pressure generated by the object through the curved surface, thereby preventing the first case body and the second case body from sagging out of the case structure.

17 Claims, 14 Drawing Sheets

CASE STRUCTURE AND METHOD FOR PRE-FORMING THE SAME

BACKGROUND OF THE INVENTION

1. Field of the Invention

The present invention relates to a case structure, and more particularly to a case structure capable of preventing the case from sagging and a method for manufacturing the same.

2. Related Art

Currently, in a process of processing a plate material of a case of an electronic device, structures such as strengthening or reinforcing ribs are often pressed on the plate material forming the case, so as to enhance the structural strength of the case. However, when an object is disposed in the press-formed case, the original flat surface generates a sag structure that is depressed or bent in a certain direction due to a downward pressure generated by the object. Due to the sag structure, when the cases are disposed on a rack, the two cases at upper and lower positions easily interfere or collide with each other on the rack, thereby resulting in damages to the cases and causing annoyance to an assembler during assembly.

Taking a case of a server as an example, when a cooling fan bracket, a cooling fan, a magnetic disk, and other relevant electronic components are disposed in the case, a case body located in the case generates a sag structure after the case is under the influence of the weight of the electronic components and the action of gravity for a long period of time. Further, a plurality of storage spaces of a server rack is quite close to each other. Therefore, when servers are disposed in the storage spaces, a lower server cannot be successfully accommodated in the storage space due to the sag structure of an upper server. Meanwhile, after the servers are placed for a long period of time, the two servers interfere with and contact each other due to the sag structure, such that the heat dissipation function of the servers during operation is easily affected, thereby resulting in that the performance of the servers is reduced and the servers are damaged due to excessive heat.

Currently, solutions to the generation of the sag structure in the case are generally implemented by enhancing the structural strength of the case, changing the mold design and molding capability, or strictly controlling and managing the quality. Commonly, a plurality of press lines is formed in regions where the sag structure is easily generated on a bottom plate of the plate material forming the case, but the press lines can only alleviate the sag problem in the same extending direction on the plate material. Therefore, if it is desired to solve the problem of the sag structural surface of the bottom plate of the whole case at the same time, a considerable amount of press lines need to be formed on the bottom plate or deeper press lines need to be formed. However, the arrangement of the press lines damages the body structure of the bottom plate, and the more the press lines are arranged, the more seriously the structural strength of the plate material is affected, and no effective solution can be provided for the regions where the sag structure is easily generated on the whole bottom plate.

Therefore, in the prior art, in order to solve the problem that the sag structure is easily generated after the object is disposed in the case, the press lines are used to reinforce a single axial region on the bottom plate, which not only results in a complex process that requires repeatedly arranging the press lines on the plate material, but also easily causes a reduction of the structural strength of the bottom plate.

SUMMARY OF THE INVENTION

In view of the above problems, the present invention is a case structure and a method for pre-forming the same, which can solve the problem in the prior art that after an object is disposed in a case, a side surface of the case supporting the object easily generates a sag structure after loading, resulting in that when a plurality of cases is disposed on a rack, the two cases located at upper and lower positions of the rack interfere or collide with each other.

The present invention provides a case structure, which comprises a first case body and a second case body. The first case body has a supporting plate and two opposite side walls, and the two side walls are disposed on two side edges of the supporting plate. The second case body has a bottom plate and two opposite side plates, the two side plates are disposed on two side edges of the bottom plate, and the two side plates respectively form an initial angle smaller than 90° with the bottom plate. The second case body is disposed in the first case body, the two side plates of the second case body are respectively close to the two side walls of the first case body, and the bottom plate of the second case body forms a curved surface in the first case body.

The present invention further provides a method for pre-forming a case structure, which comprises: providing a first case body, having a supporting plate and two opposite side walls, in which the two side walls are disposed on two side edges of the supporting plate; providing a second case body, having a bottom plate and two opposite side plates, in which the two side plates are disposed on two side edges of the bottom plate; bending the two side plates of the second case body, such that the two side plates respectively form an initial angle with the bottom plate, in which the initial angle is smaller than 90°; disposing the second case body in the first case body; and pulling the two side plates of the second case body to respectively come close to the two side walls, such that the bottom plate is bent opposite to the supporting plate and forms a curved surface in the first case body.

In the case structure and the method for pre-forming the same of the present invention, the two side plates of the second case body of the case structure are bent relative to the bottom plate, such that after the second case body is fixed to the first case body, the bottom plate forms a curved surface in the first case body. The case structure can overcome a downward pressure generated by an object in the case structure through a surface tension of the curved surface, and meanwhile, a buffer space is formed between the bottom plate of the second case body and the supporting plate of the first case body, so as to prevent the bottom plate of the second case body from sagging towards the supporting plate, and enable the supporting plate of the first case body to maintain a flat shape. Therefore, when a plurality of case structures is disposed on a rack, the two cases respectively placed at upper and lower positions do not interfere or collide with each other.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

In a method for pre-forming a case structure of the present invention, the case structure is formed by ductile metal plates, and the case structure is a case applied to an electronic device, or an iron cabinet, an iron box, or other case structures requiring press forming. In the present invention, a case structure forming a housing of a server is taken as an example, but the present invention is not limited thereto.

Figure 1:
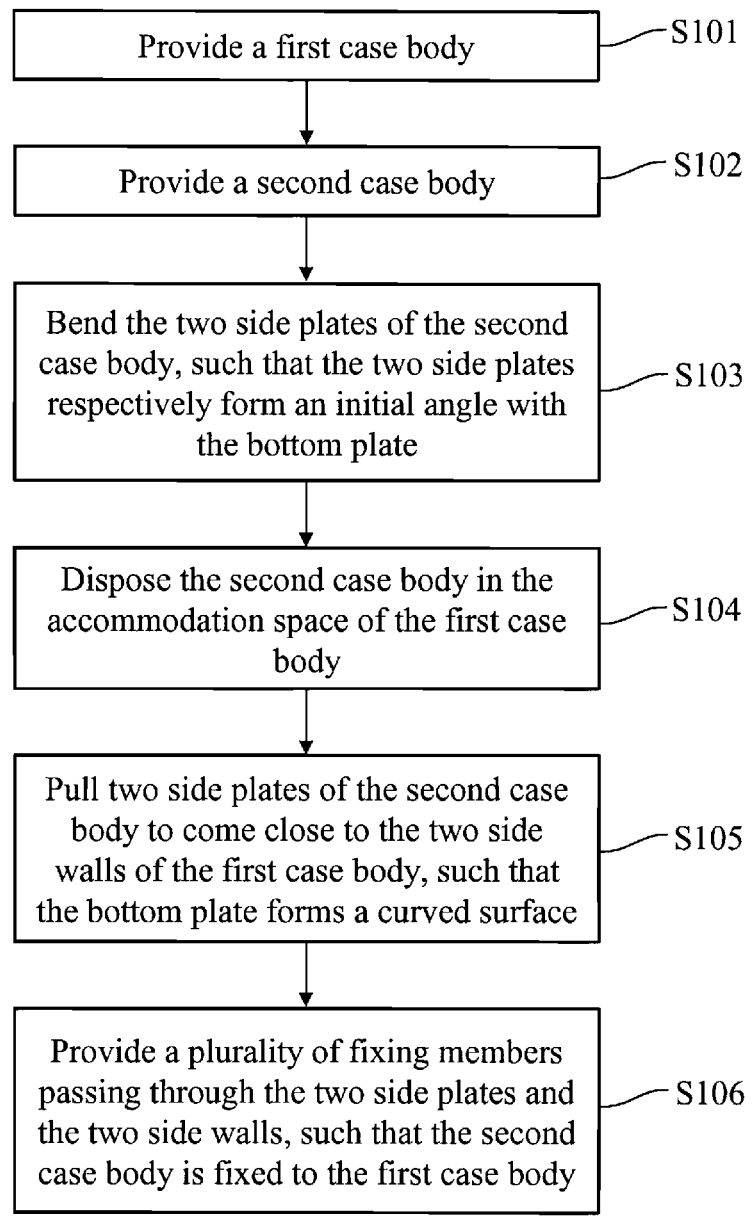
FIG. 1 is a schematic flow chart of a pre-forming method according to a first embodiment of the present invention.
Figure 2:
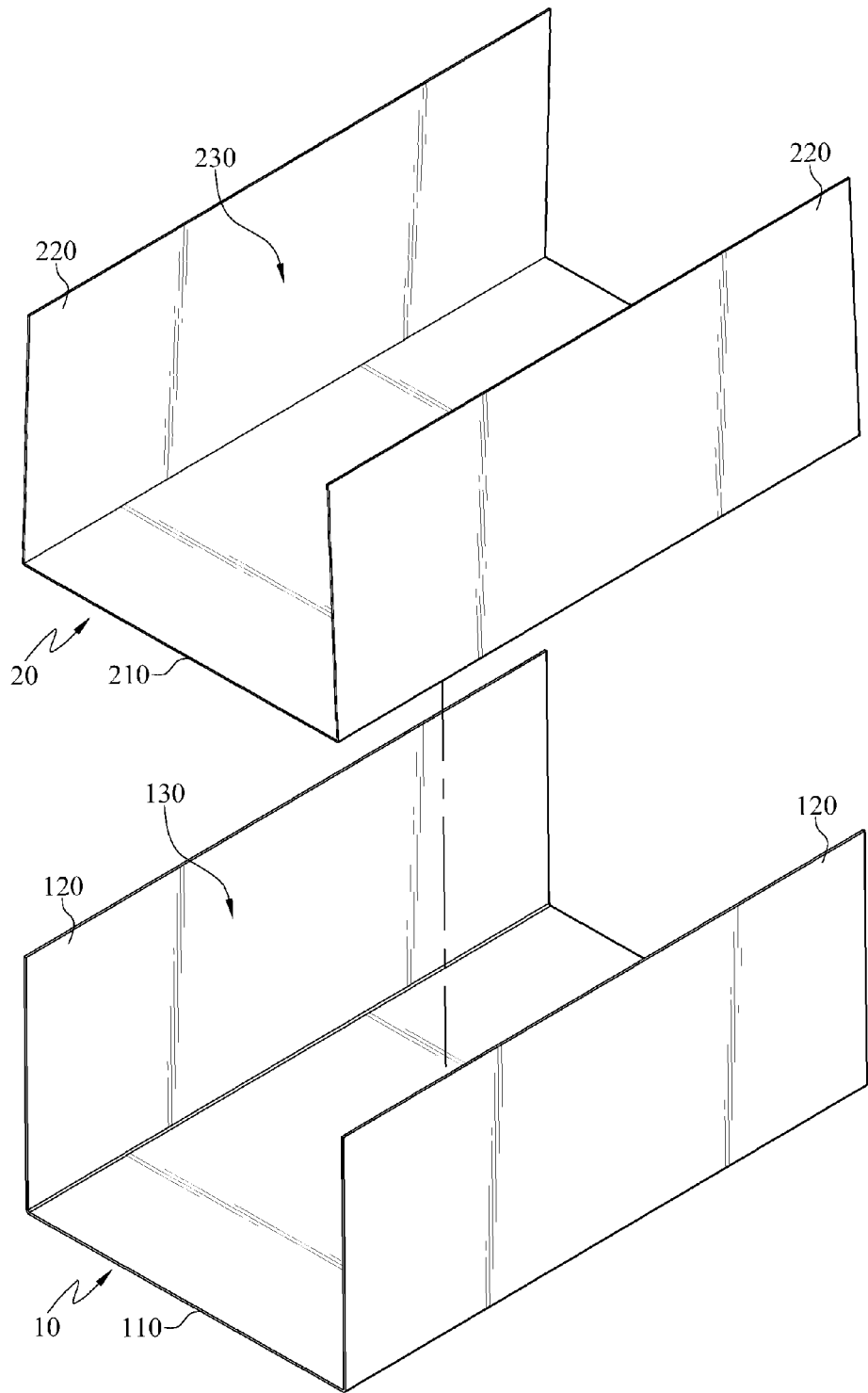
FIG. 2 is a schematic three-dimensional exploded view of the first embodiment of the present invention.
Figure 3:
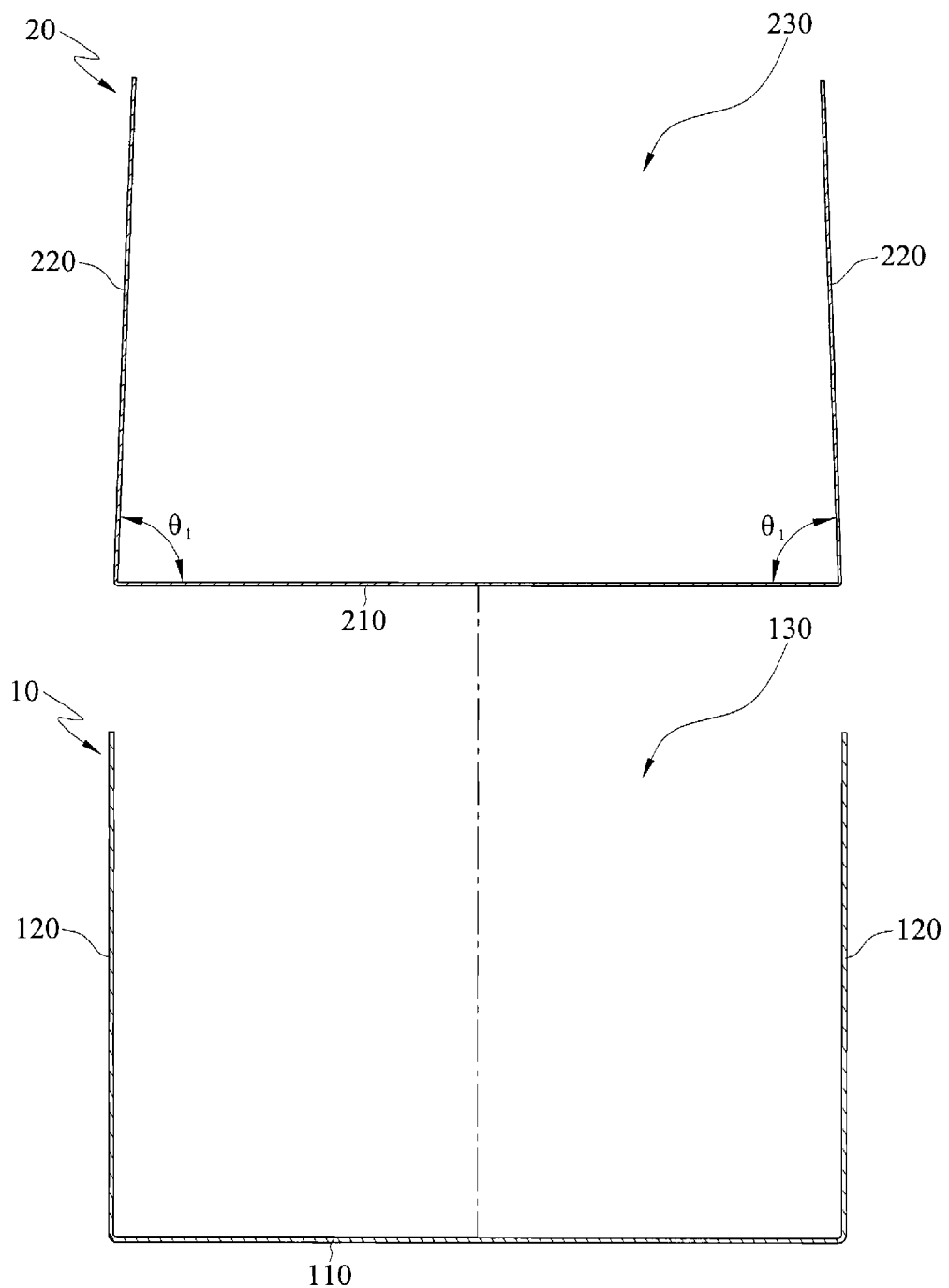
FIG. 3 is a schematic exploded cross-sectional view of the first embodiment of the present invention.

Referring to FIGS. 1 to 3, in a method for pre-forming a case structure according to a first embodiment of the present invention, firstly, a first case body 10 is provided (S101), in which the first case body 10 has a supporting plate 110 and two opposite side walls 120, the two side walls 120 are respectively disposed on two side edges of the supporting plate 110, and the two side walls 120 are perpendicular to the supporting plate 110, such that an accommodation space 130 is formed between the supporting plate 110 and the two side walls 120. Next, a second case body 20 is provided (S102), in which the second case body has a bottom plate 210 and two opposite side plates 220, and the two side plates 220 are respectively disposed on two side edges of the bottom plate 210, such that another accommodation space 230 is formed between the bottom plate 210 and the two side plates 220. Then, the two side plates 220 of the second case body 20 are bent, such that the two side plates 220 respectively form an initial angle $\theta_1$ smaller than 90°, for example, an initial angle $\theta_1$ between 85° and 89°, with the bottom plate 210 (S103). In the first embodiment of the present invention, an initial angle $\theta_1$ of 88° is taken as an example, but the present invention is not limited thereto.

The steps of providing the second case body 20 and bending the two side plates 220 of the second case body 20 may be performed before the step of providing the first case body 10, which merely indicates that the steps are performed in different orders, but is not intended to limit the present invention.

Figure 4:
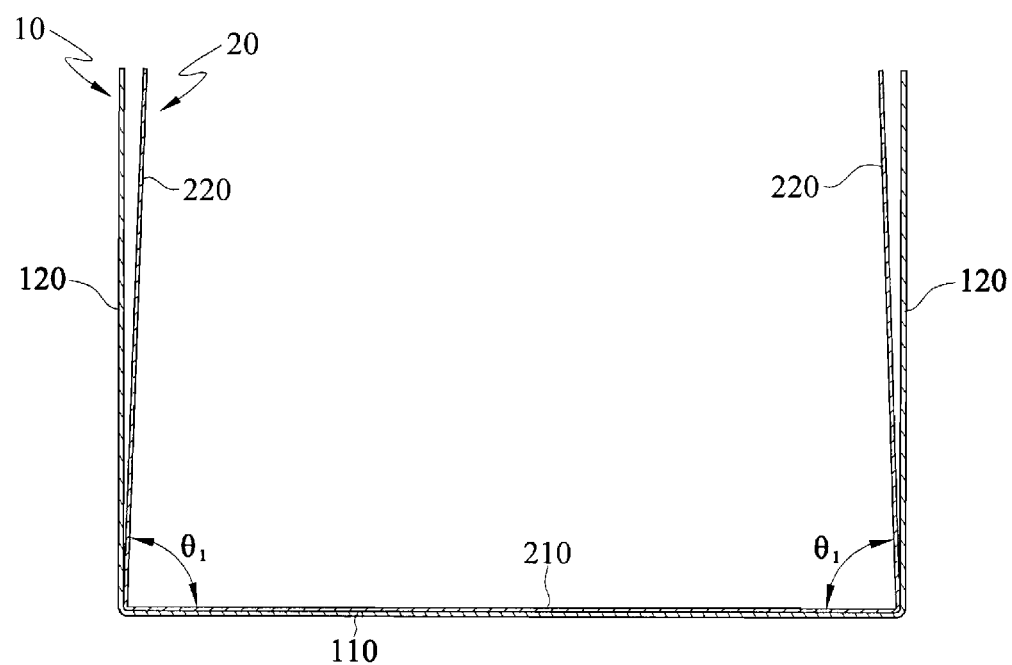
FIG. 4 is a schematic combined cross-sectional view of the first embodiment of the present invention.

Referring to FIG. 4, after the two side plates 220 of the second case body 20 respectively form the initial angle $\theta_1$ with the bottom plate 210, the second case body 20 is disposed in the accommodation space 130 of the first case body 10 (S104). Next, the two side plates 220 of the second case body 20 are pulled, such that the two side plates 220 respectively come close to the two side walls 120 of the first case body 10 on two opposite sides of the second case body 20. At this time, pushed by the two side plates 220, the two opposite side edges of the bottom plate 210 of the second case body 20 generate a counter force, such that the bottom plate 210 is bent opposite to the supporting plate 110 of the first case body 10, and forms a curved surface 211 in the first case body 10 (S105).

Figure 5:
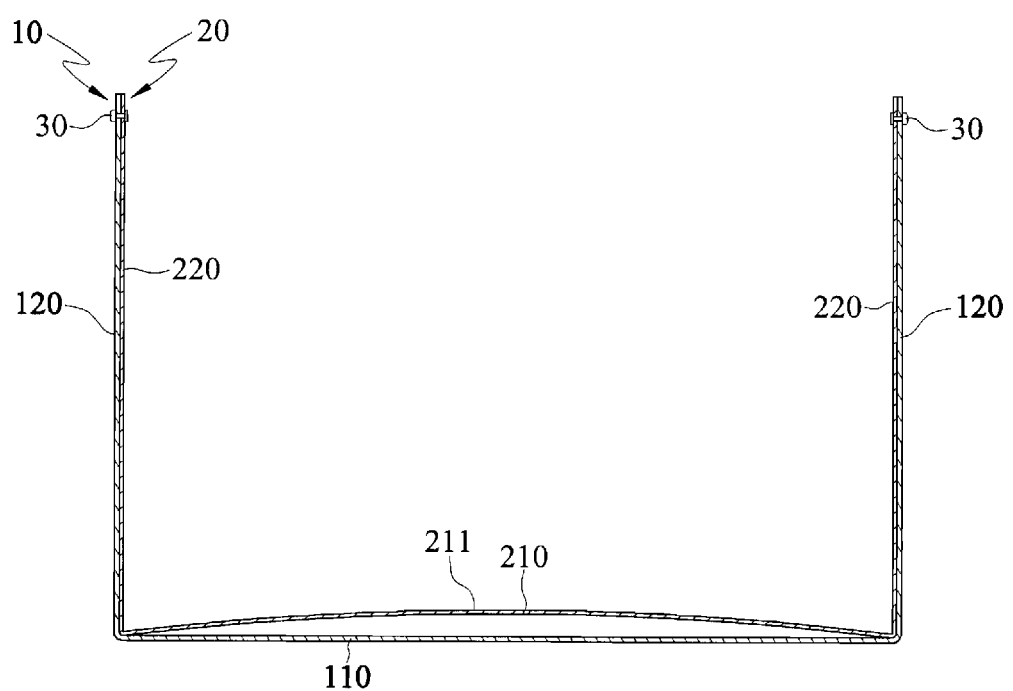
FIG. 5 is a schematic assembled cross-sectional view of the first embodiment of the present invention.
Figure 6:
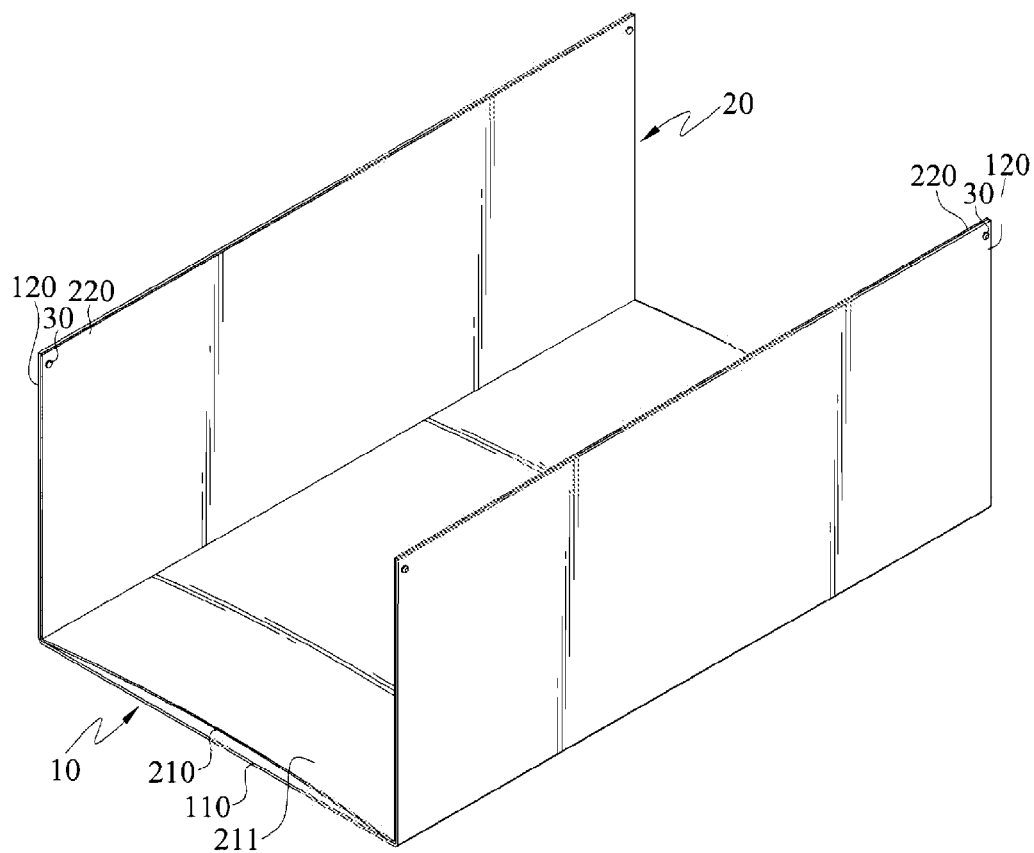
FIG. 6 is a schematic three-dimensional assembled view of the first embodiment of the present invention.

Referring to FIGS. 5 and 6, then, a plurality of fixing members 30, for example, rivets or screws, is provided, which respectively pass through the other end of the two side plates 220 of the second case body 20 opposite to the bottom plate 210, and are fixed to the other end of the two side walls 120 of the first case body 10 opposite to the supporting plate 110, such that the second case body 20 is fixed in the first case body 10 in such a manner that the bottom plate 210 forms the curved surface 211 (S106). In addition, optionally, a plurality of fixing members 30 passes through the bottom plate 210 of the second case body 20 and is fix to the supporting plate 110 of the first case body 10 (not shown), so as to further enhance the stability of the combination of the second case body 20 with the first case body 10. For the step of providing the plurality of fixing members 30, the use of the fixing members 30 may also be replaced by soldering or other fixing methods, such that the second case body 20 is fixed in the first case body 10, and the bottom plate 210 of the second case body 20 normally maintains the form of the curved surface 211.

Figure 7:
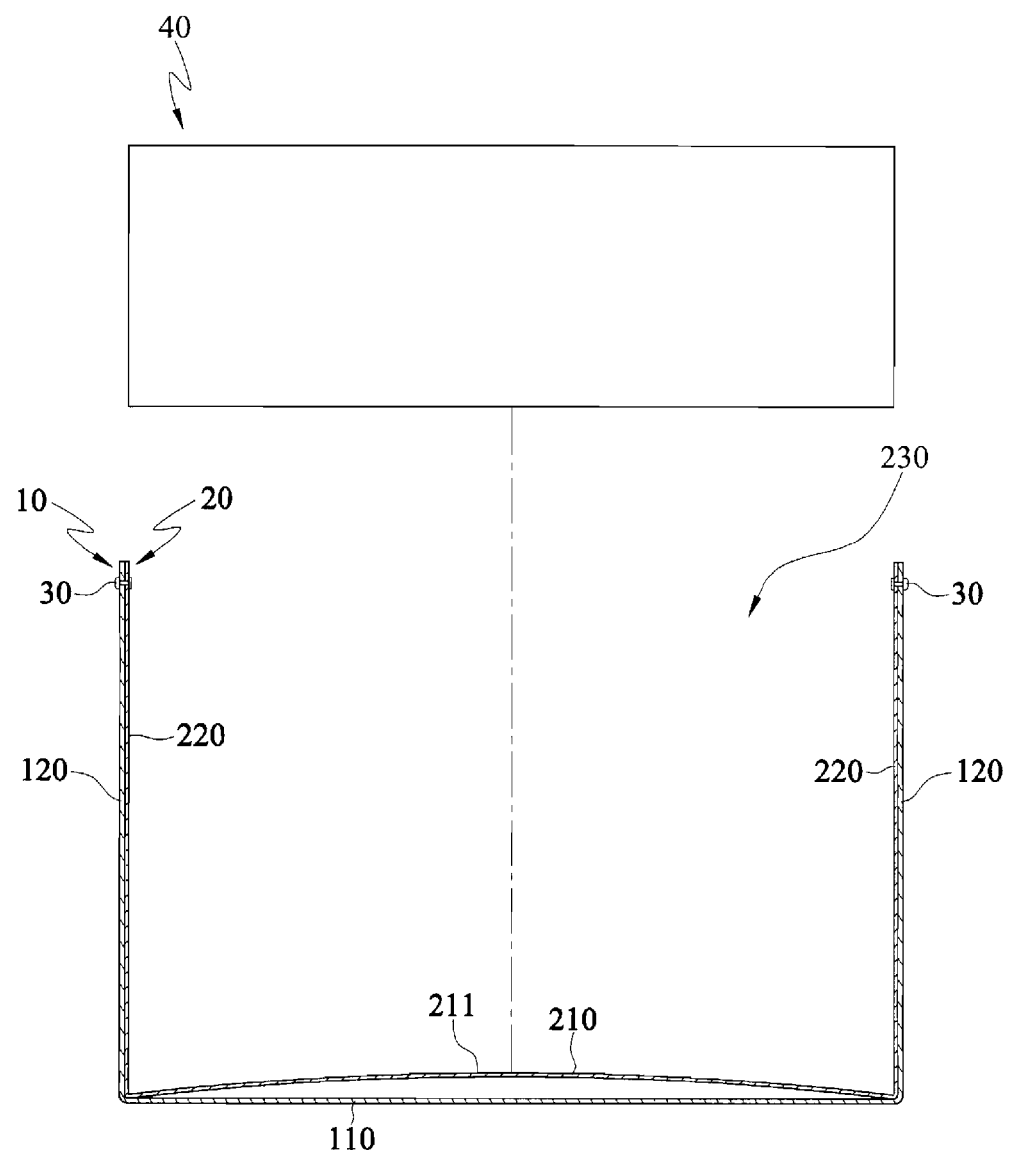
FIGS. 7 and 8 are schematic views illustrating a use state according to the first embodiment of the present invention.
Figure 8:
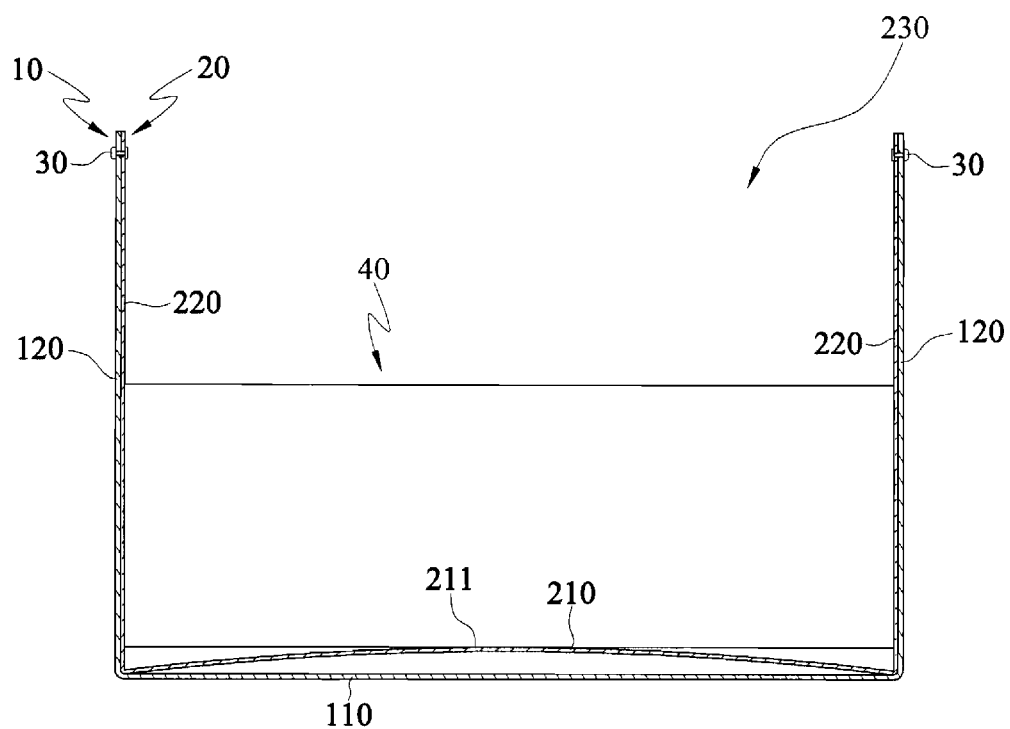

Referring to FIGS. 7 and 8, after the pre-forming step, the bottom plate 210 of the second case body 20 forms the curved surface 211 in the case structure, and a gap is formed between the bottom plate 210 of the second case body 20 and the supporting plate 110 of the first case body 10. Therefore, when an object 40 (for example, a cooling fan bracket, a circuit board, or a memory slot) is disposed in the accommodation space 230 of the second case body 20, a downward pressure generated by the object 40 on the bottom plate 210 of the second case body 20 is pushed by a surface tension of the curved surface 211 of the bottom plate 210, and meanwhile, a buffer space is provided by the gap between the bottom plate 210 and the supporting plate 110, such that the bottom plate 210 can normally maintain the bent shape, so as to prevent the downward pressure generated by the object 40 from being directly applied to the supporting plate 110 of the first case body 10, thereby preventing the supporting plate 110 of the first case body 10 from bending and sagging opposite to the bottom plate 210.

Therefore, when a plurality of case structures is disposed on a rack (not shown), the two neighboring case structures located at upper and lower positions of the rack do not interfere or collide with each other, such that the case structures can be successfully mounted on the rack without being damaged due to collision.

Figure 9:
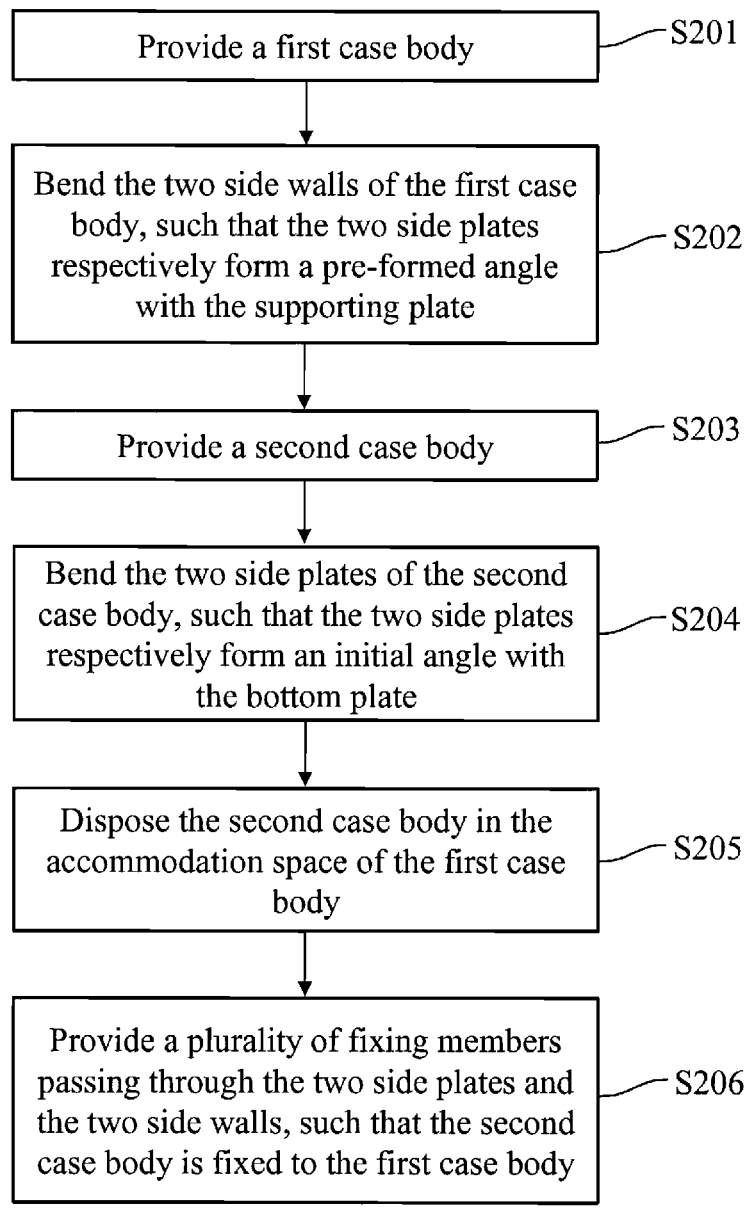
FIG. 9 is a schematic flow chart of a pre-forming method according to a second embodiment of the present invention.
Figure 10:
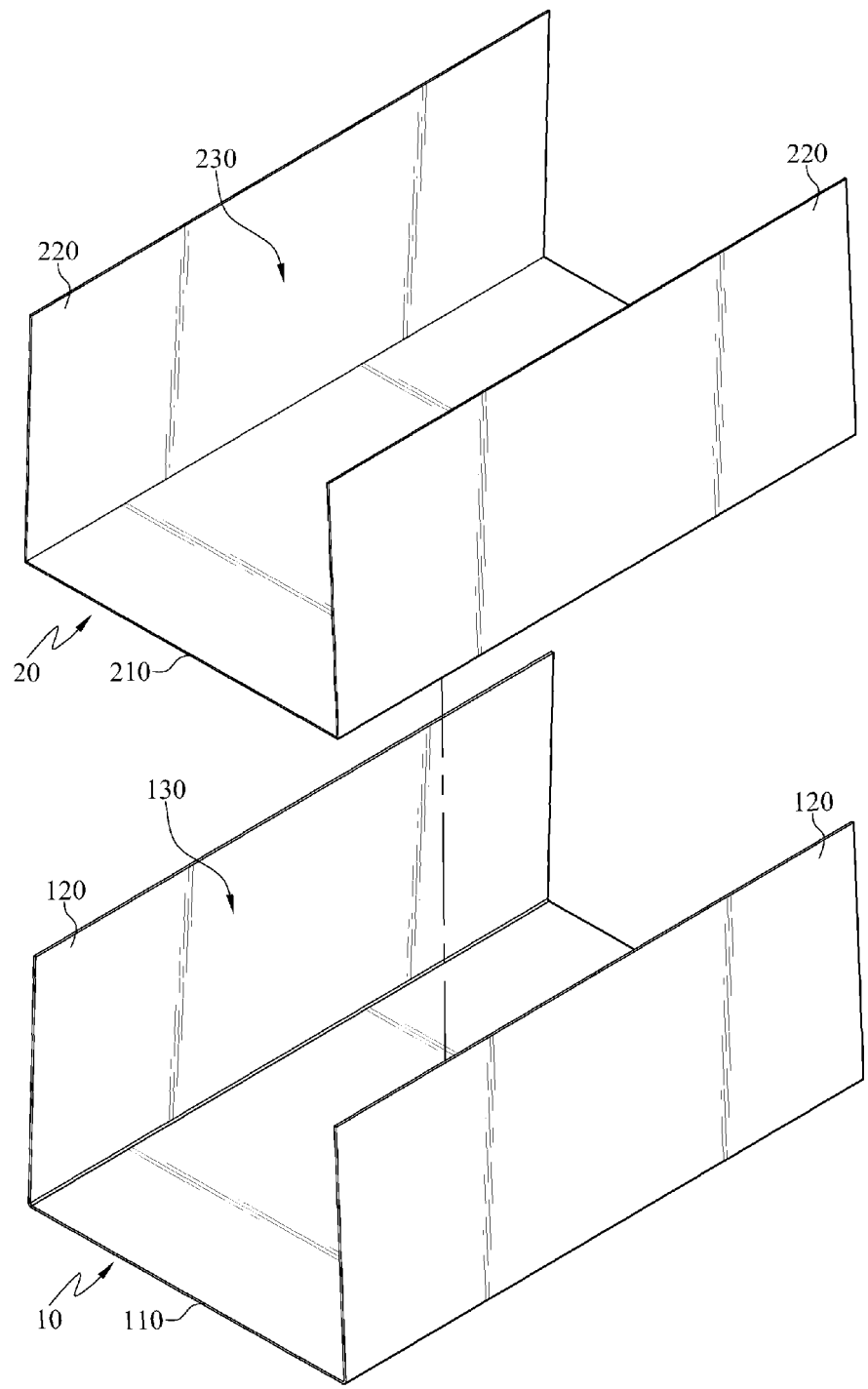
FIG. 10 is a schematic three-dimensional exploded view of the second embodiment of the present invention.
Figure 11:
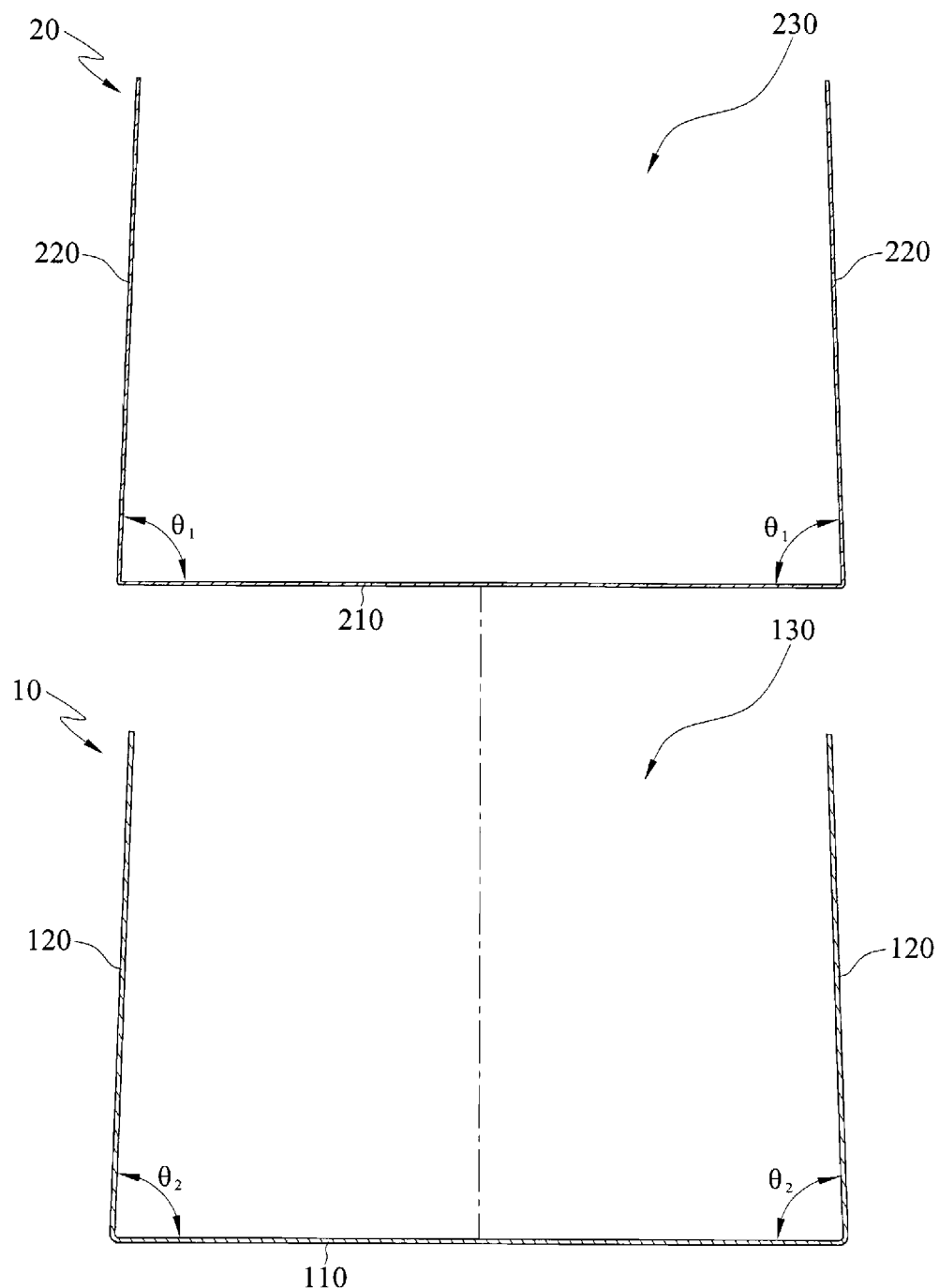
FIG. 11 is a schematic exploded cross-sectional view of the second embodiment of the present invention.

Referring to FIGS. 9 to 11, in a method for pre-forming a case structure according to a second embodiment of the present invention, firstly, a first case body 10 is provided (S201), in which the first case body 10 has a supporting plate 110 and two opposite side walls 120, and the two side walls 120 are respectively disposed on two side edges of the supporting plate 110, such that an accommodation space 130 is formed between the supporting plate 110 and the two side walls 120. Next, the two side walls 120 of the first case body 10 are bent, such that the two side walls 120 respectively form a pre-formed angle $\theta_2$ smaller than 90°, for example, an pre-formed angle $\theta_2$ of 89°, with the supporting plate (S202). Further, a second case body 20 is provided (S203), in which the second case body has a bottom plate 210 and two opposite side plates 220, and the two side plates 220 are respectively disposed on two side edges of the bottom plate 210, such that another accommodation space 230 is formed between the bottom plate 210 and the two side plates 220. Then, the two side plates 220 of the second case body 20 are bent, such that the two side plates 220 respectively form an initial angle $\theta_1$ smaller than 90°, for example, an initial angle $\theta_1$ of 88°, with the bottom plate 210 (S204).

Figure 12:
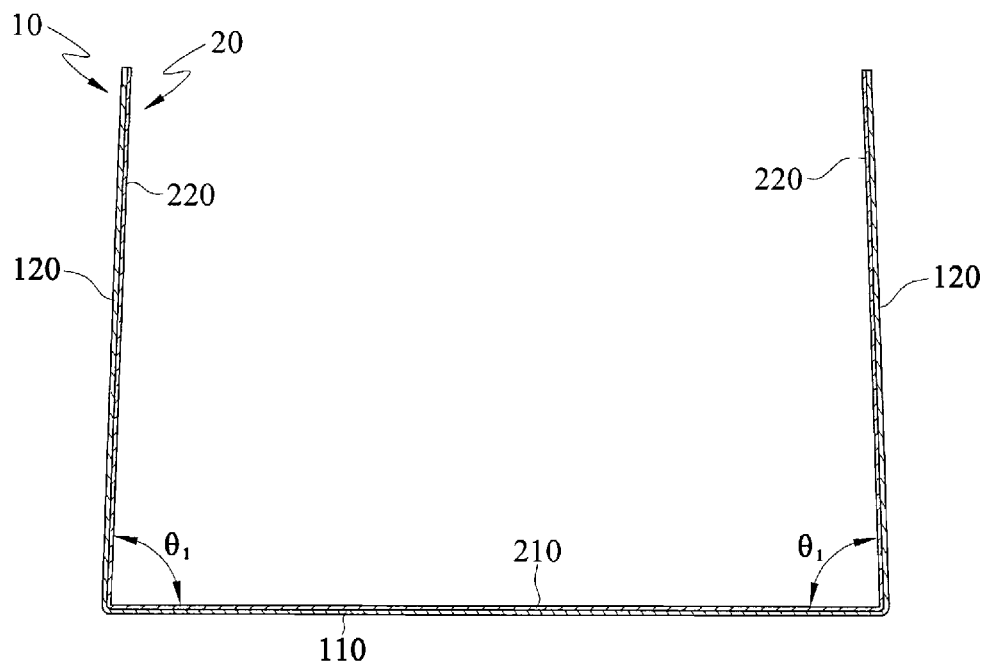
FIG. 12 is a schematic combined cross-sectional view of the second embodiment of the present invention.
Figure 13:
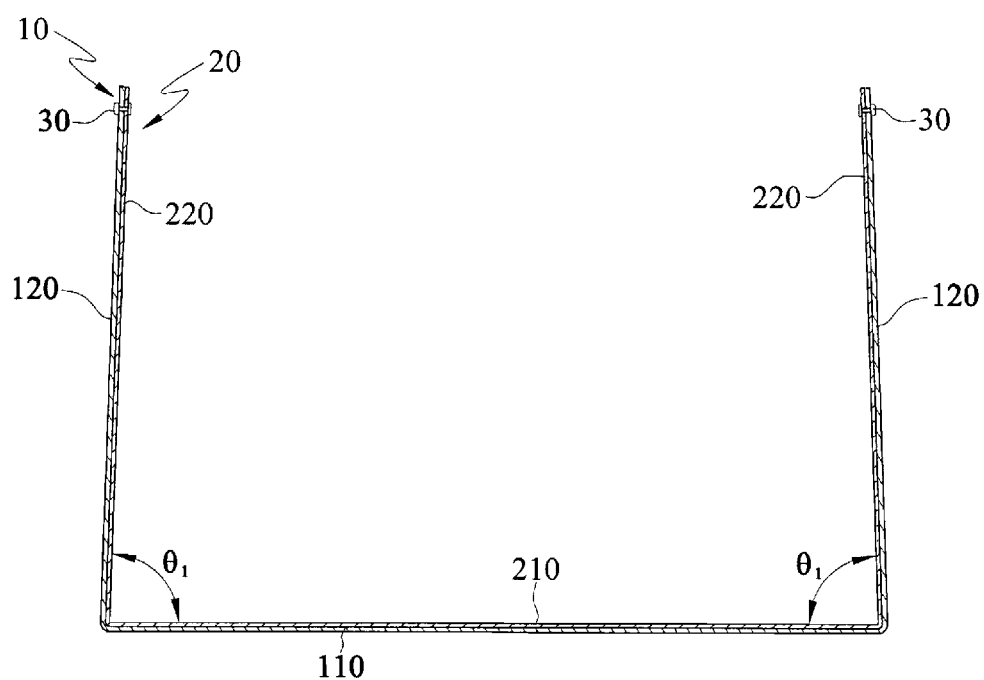
FIG. 13 is a schematic assembled cross-sectional view of the second embodiment of the present invention.

Referring to FIG. 12, after the two side walls 120 of the first case body 10 respectively form the pre-formed angle $\theta_2$ with the supporting plate 110, and the two side plates of the second case body respectively form the initial angle $\theta_1$ with the bottom plate, the second case body 20 is disposed in the accommodation space 130 of the first case body 10 (S205), such that the second case body 20 is adhered to the first case body 10 in the accommodation space 130. Then, optionally, a plurality of fixing members 30 (for example, rivets or screws) is provided, which respectively passes through the two side plates 220 of the second case body 20, and is fixed on the two side walls 120 of the first case body 10 (S206), such that the second case body 20 is stably combined with the first case body 10 (as shown in FIG. 13).

Figure 14:
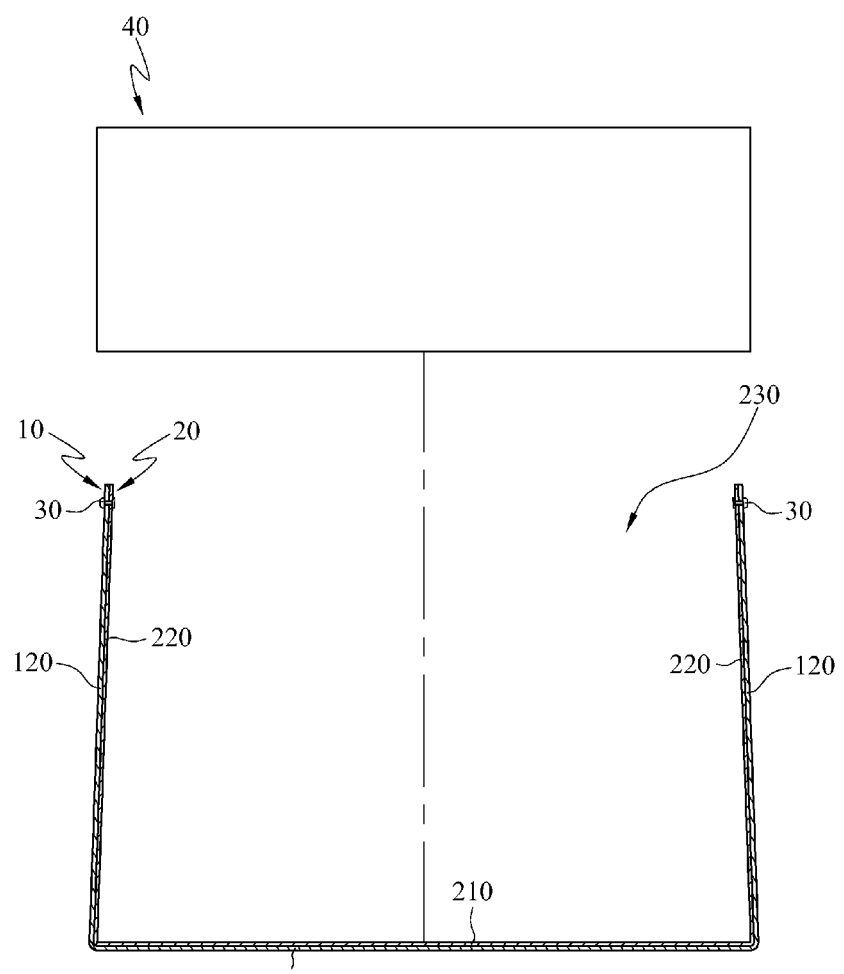
FIGS. 14 and 15 are schematic views illustrating a use state according to the second embodiment of the present invention.
Figure 15:
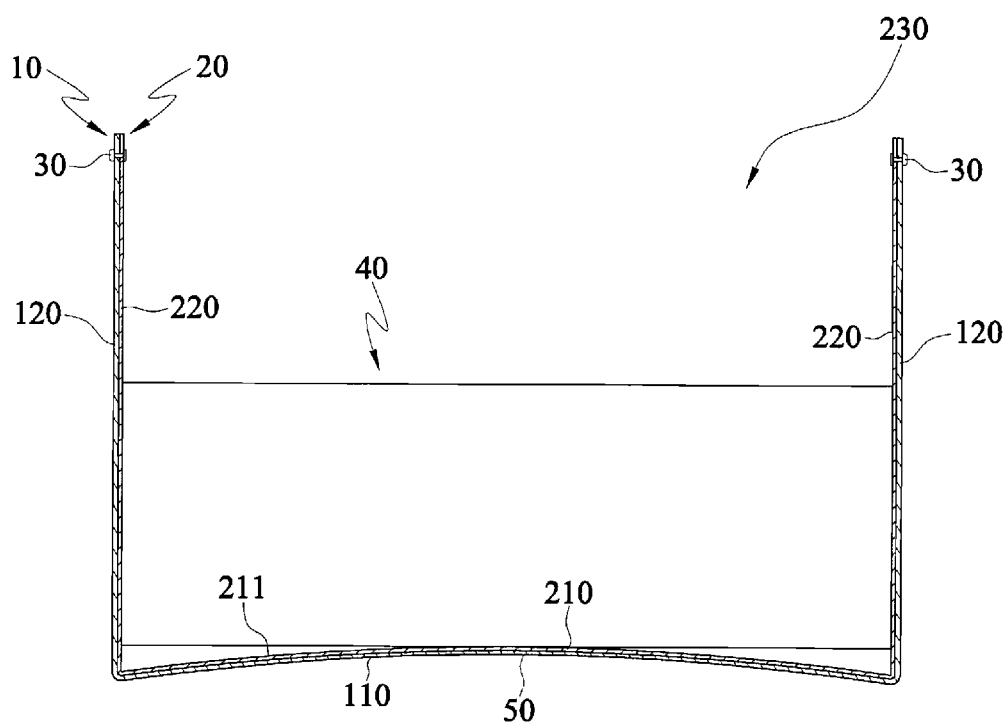

Referring to FIGS. 14 and 15, after the pre-forming step of the case structure is finished, the two side walls 120 of the first case body 10 respectively form the pre-formed angle $\theta_2$ with the supporting plate 110, and the two side plates 220 of the second case body 20 respectively form the initial angle $\theta_1$ with the bottom plate 210. Therefore, when an object 40 is disposed in the accommodation space 230 of the second case body 20, the two side plates 220 of the second case body 20 are pushed by the object 40 to shift towards the first case body 10, and at the same time drive the two side walls 120 of the first case body 10 to move. At this time, the two side plates 220 and the two side walls 120 respectively generate an extrusion force towards the center of the bottom plate 210 and the center of the supporting plate 110 on one end of the two side plates 220 connected to the bottom plate 210 and one end of the two side walls 120 connected to the supporting plate 110, such that the bottom plate 210 and the supporting plate 110 are bent towards the object 40 at the same time, thereby forming a curved surface 50 on the case structure.

Likewise, the case structure can overcome a downward pressure generated by the object on the second case body 20 and the first case body 10 through a surface tension of the curved surface 50, thereby solving the problem that two case structures are easily damaged due to interference or collision with each other caused by sagging of the case bodies of the case structures.

In the case structure of the present invention, the initial angles are formed between the two side plates and the bottom plate of the second case body, such that after the second case body is fixed to the first case body, a curved surface is formed in the first case body; alternatively, at the same time, the pre-formed angles are formed between the two side walls and the supporting plate of the first case body, such that after the object is disposed in the case structure, another curved surface is formed. The case structure can overcome the downward pressure generated by the object in the case structure through the surface tension of the curved surface. Therefore, the case bodies of the case structure are prevented from sagging and protruding from a surface of the case structure, such that the case structure, when disposed on a rack, does not interfere or collide with other case structures on the rack.

What is claimed is:

1. A case structure, comprising:
    a first case body, having a supporting plate and two opposite side walls, wherein the two side walls are disposed on two side edges of the supporting plate;
    a second case body, having a bottom plate and two opposite side plates, wherein the two side plates are respectively disposed on two side edges of the bottom plate, each of the side plates forms an initial angle with the bottom plate, and the initial angle is smaller than 90°, and wherein the second case body is disposed in the first case body, the two side plates are respectively close to the two side walls so that the bottom plate forms a curved surface; and
    a plurality of fixing members, passing through the two side plates and fixed on the two side walls.

2. The case structure according to claim 1, wherein the initial angle is between 85° and 89°.

3. The case structure according to claim 2, wherein the initial angle is 88°.

4. The case structure according to claim 1, wherein the two side walls are perpendicularly disposed on the supporting plate.

5. The case structure according to claim 1, wherein each of the side walls forms a predetermined angle with the supporting plate, and the predetermined angle is smaller than 90°.

6. The case structure according to claim 5, wherein the predetermined angle is larger than the initial angle.

7. The case structure according to claim 5, wherein the predetermined angle is between 85° and 89°.

8. The case structure according to claim 7, wherein the predetermined angle is 88°.

9. A method for pre-forming a case structure, comprising:
    providing a first case body, having a supporting plate and two opposite side walls, wherein the two side walls are disposed on two side edges of the supporting plate, and the two side walls are perpendicular to the supporting plate;
    providing a second case body, having a bottom plate and two opposite side plates, wherein the two side plates are disposed on two side edges of the bottom plate;
    bending the two side plates of the second case body, such that the two side plates respectively form an initial angle with the bottom plate, wherein the initial angle is smaller than 90°;
    disposing the second case body in the first case body;
    pulling the two side plates to respectively come close to the two side walls, such that the bottom plate is bent opposite to the supporting plate and forms a curved surface; and
    providing a plurality of fixing members passing through the two side plates and fixed on the two side walls.

10. The method for pre-forming the case structure according to claim 9, wherein the initial angle is between 85° and 89°.

11. The method for pre-forming the case structure according to claim 10, wherein the initial angle is 88°.

12. The method for pre-forming the case structure according to claim 9, wherein before the step of disposing the second case body in the first case body, the method further comprises:
    bending the two side walls of the first case body, such that the two side walls respectively form a predetermined angle with the supporting plate.

13. The method for pre-forming the case structure according to claim 12, wherein the predetermined angle is larger than the initial angle.

14. The method for pre-forming the case structure according to claim 12, wherein the predetermined angle is smaller than 90°.

15. The method for pre-forming the case structure according to claim 14, wherein the predetermined angle is between 85° and 89°.

16. The method for pre-forming the case structure according to claim 15, wherein the predetermined angle is 88°.

17. A case structure, comprising:
    a first case body, having a supporting plate and two opposite side walls, wherein the two side walls are disposed on two side edges of the supporting plate;

a second case body, having a bottom plate and two opposite side plates, wherein the two side plates are respectively disposed on two side edges of the bottom plate, each of the side plates forms an initial angle with the bottom plate, and the initial angle is smaller than 90°; and a plurality of fixing members, passing through the two side plates and fixed on the two side walls;

wherein the second case body is disposed in the first case body, the two side plates are respectively close to the two side walls, and the bottom plate forms a curved surface.

* * * * *